United States Patent
Cheng et al.

(10) Patent No.: US 9,627,382 B2
(45) Date of Patent: Apr. 18, 2017

(54) CMOS NFET AND PFET COMPARABLE SPACER WIDTH

(71) Applicant: International Business Machines Corporation, Armonk, NY (US)

(72) Inventors: Kangguo Cheng, Schenectady, NY (US); Injo Ok, Loudonville, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/079,613

(22) Filed: Mar. 24, 2016

(65) Prior Publication Data

US 2016/0240535 A1  Aug. 18, 2016

Related U.S. Application Data

(62) Division of application No. 14/622,957, filed on Feb. 16, 2015, now Pat. No. 9,330,983.

(51) Int. Cl.
*H01L 21/70* (2006.01)
*H01L 27/092* (2006.01)
*H01L 21/8238* (2006.01)
*H01L 29/06* (2006.01)

(52) U.S. Cl.
CPC .... *H01L 27/092* (2013.01); *H01L 21/823814* (2013.01); *H01L 21/823828* (2013.01); *H01L 21/823864* (2013.01); *H01L 29/0657* (2013.01)

(58) Field of Classification Search
CPC ............. H01L 21/8238; H01L 27/0922; H01L 2029/7858
See application file for complete search history.

(56) References Cited

U.S. PATENT DOCUMENTS

| | | | |
|---|---|---|---|
| 5,677,563 A | 10/1997 | Cronin et al. | |
| 6,469,347 B1 | 10/2002 | Oda et al. | |
| 6,524,916 B1 | 2/2003 | Scholer et al. | |
| 8,283,233 B2 | 10/2012 | Balasubramanian | |
| 8,609,497 B2 | 12/2013 | Chung et al. | |
| 2009/0020795 A1* | 1/2009 | Doi ................... | H01L 27/14689 257/292 |
| 2013/0015525 A1 | 1/2013 | Cheng et al. | |
| 2014/0015060 A1* | 1/2014 | Flachowsky .......... | H01L 27/092 257/369 |

FOREIGN PATENT DOCUMENTS

JP  2004-063746 A  2/2004

OTHER PUBLICATIONS

Ullah, Notice of Allowance and Fee(s) Due for U.S. Appl. No. 14/622,957 dated Feb. 4, 2016, 13 pages.

* cited by examiner

*Primary Examiner* — Elias M Ullah
(74) *Attorney, Agent, or Firm* — Steven J. Meyers; Hoffman Warnick LLC

(57) ABSTRACT

Embodiments of the present disclosure provide a structure including: a p-type field effect transistor (pFET device) and an n-type field effect transistor (nFET device) each having sidewall spacers on opposite sidewalls of a gate and source drain region adjacent to the sidewall spacers, a distance between the pFET source drain region and the pFET gate is substantially equal to a distance between the nFET source drain region and the nFET gate.

10 Claims, 14 Drawing Sheets

CMOS NFET AND PFET COMPARABLE SPACER WIDTH

The present invention generally relates to semiconductor manufacturing, and more particularly to complementary metal-oxide-semiconductor (CMOS) n-type field effect transistor (nFET) and p-type field effect transistor (pFET) having comparable gate sidewall spacer width or lateral thickness.

Complementary Metal-oxide-semiconductor (CMOS) technology is commonly used for fabricating field effect transistors (FET) as part of advanced integrated circuits (IC), such as CPUs, memory, storage devices, and the like. Most common among these may be metal-oxide-semiconductor field effect transistors (MOSFET), in which a gate structure may be energized to create an electric field in an underlying channel region of a substrate, by which charge carriers are allowed to travel through the channel region between a source region and a drain region of the substrate. FinFETs are three dimensional (3D), fully depleted MOSFET devices having a fin structure formed from the substrate material. The gate structure may wrap a portion of the fin acting as the channel region. The portion of the fin not covered by the gate structure may define the source drain region of the semiconductor device.

SUMMARY

According to an embodiment of the present invention, a method is provided. The method may include forming a p-type field effect transistor (pFET device) and an n-type field effect transistor (nFET device), each having sidewall spacers on opposite sidewalls of a dummy gate, and source drain regions adjacent to the sidewall spacers, conformally forming a first liner on the sidewall spacers of both the pFET device and the nFET device, depositing a fill material directly above and in direct contact with the first liner, such that an upper surface of the fill material is substantially flush with an upper surface of a portion of the first liner above the dummy gates of both the pFET device and the nFET device, and removing a portion of the fill material and a portion of the first liner to expose only the pFET device, an etch rate of the first liner is substantially different from an etch rate of the sidewall spacers of the pFET device, such that the portion of the first liner is removed in its entirety selective to the sidewall spacers of the pFET device. The method may further include conformally forming a second liner above and in direct contact with the pFET device and along a vertical sidewall of a remaining portion of the fill material above the nFET device, depositing a first inter level dielectric above the second liner, removing the remaining portion of the fill material and a remaining portion of the first liner to expose the nFET device, the etch rate of the first liner is substantially different from an etch rate of the sidewall spacers of the nFET device, such that the remaining portion of the first liner is removed in its entirety selective to the sidewall spacers of the nFET device, and conformally forming a third liner above and in direct contact with the nFET device and in direct contact with a vertical portion of the second liner.

The method may further include removing the portion of the fill material and the portion of the first liner to expose only the pFET device includes depositing a photo resist directly above only the nFET device, removing the portion of the fill material directly above the pFET device, removing the portion of the first liner directly above the pFET device, and removing the photo resist. Removing the remaining portion of the fill material and the remaining portion of the first liner to expose the nFET device includes depositing a second photo resist directly above only the pFET device, removing a portion of the second liner directly above the nFET device, removing the remaining portion of the fill material directly above the nFET device, removing the remaining portion of the first liner directly above the nFET device. A distance between the pFET source drain region and the pFET dummy gate is substantially equal to a distance between the nFET source drain region and the nFET dummy gate. The method further includes growing an epitaxy in the source drain regions of the pFET device, and growing a second epitaxy in the source drain region of the nFET device. A width or lateral thickness of the pFET sidewall spacers are substantially equal to a second width or lateral thickness of the nFET sidewall spacers. The first liner includes silicon oxide and the fill material includes amorphous silicon. In an alternate embodiment of this method, the liner includes a metal and the fill material includes a dielectric material.

According to another embodiment of the present invention, a method is provided. A method may include forming a p-type field effect transistor (pFET device) and an n-type field effect transistor (nFET device) each having sidewall spacers on opposite sidewalls of a dummy gate, conformally forming a first liner on the nFET device and depositing a fill material directly on the first liner of the nFET device, protecting the nFET device while growing an epitaxy in a source drain region of the pFET device, conformally forming a second liner above and in direct contact with the pFET device, including the epitaxy in the source drain regions of the pFET device, and along a vertical sidewall of a remaining portion of the fill material above the nFET device, depositing a first inter level dielectric above the second liner, and protecting the pFET device and the first inter level dielectric while growing a second epitaxy in a source drain region of the nFET device. Protecting the nFET device while growing an epitaxy in the source drain region of the pFET device includes depositing a photo resist directly above only the nFET device, removing a portion of the fill material directly above the pFET device, removing a portion of the first liner directly above the pFET device, removing the photo resist, and growing the epitaxy in a source drain region of the pFET device.

The method may further include protecting the pFET device and the first inter level dielectric while growing a second epitaxy in the source drain region of the nFET device includes depositing a second photo resist directly above only the pFET device, removing a portion of the second liner directly above the nFET device, removing a remainder of the fill material directly above the nFET device, removing a remainder of the first liner directly above the nFET device, removing the second photo resist, growing the second epitaxy in a source drain region of the nFET device. A distance between the pFET source drain region and the pFET dummy gate may be substantially equal to a distance between the nFET source drain region and the nFET dummy gate. A width or lateral thickness of the sidewall spacers of the pFET device may be substantially equal to a width or lateral thickness of the sidewall spacers of the nFET device. The first liner includes silicon oxide and the fill material includes amorphous silicon. In an alternate embodiment of this method, the first liner includes a metal and the fill material includes a dielectric material.

According to another embodiment of the present invention, a structure is provided. A structure may include a p-type field effect transistor (pFET device) and an n-type field effect transistor (nFET device) each having sidewall spacers on opposite sidewalls of a gate and source drain region adjacent to the sidewall spacers, a distance between the pFET source drain regions and the pFET gate is substantially equal to a distance between the nFET source drain region and the nFET gate. The structure may include a first liner above and in direct contact with the pFET sidewall spacers and the pFET source drain region, and a second liner above and in direct contact with the nFET sidewall spacers and the NFET source drain region, such that substantially vertical portions of the first liner and the second liner are in direct contact with each other. The substantially vertical portion of the first liner and the substantially vertical portion of the second liner are located between the pFET device and the nFET device, and are in direct contact with one another. The structure may have a width or lateral thickness of the sidewall spacers of the pFET device substantially equal to a width or lateral thickness of the sidewall spacers of the nFET device. The first liner may include silicon. In an alternate embodiment of this method, the first liner may include a metal.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
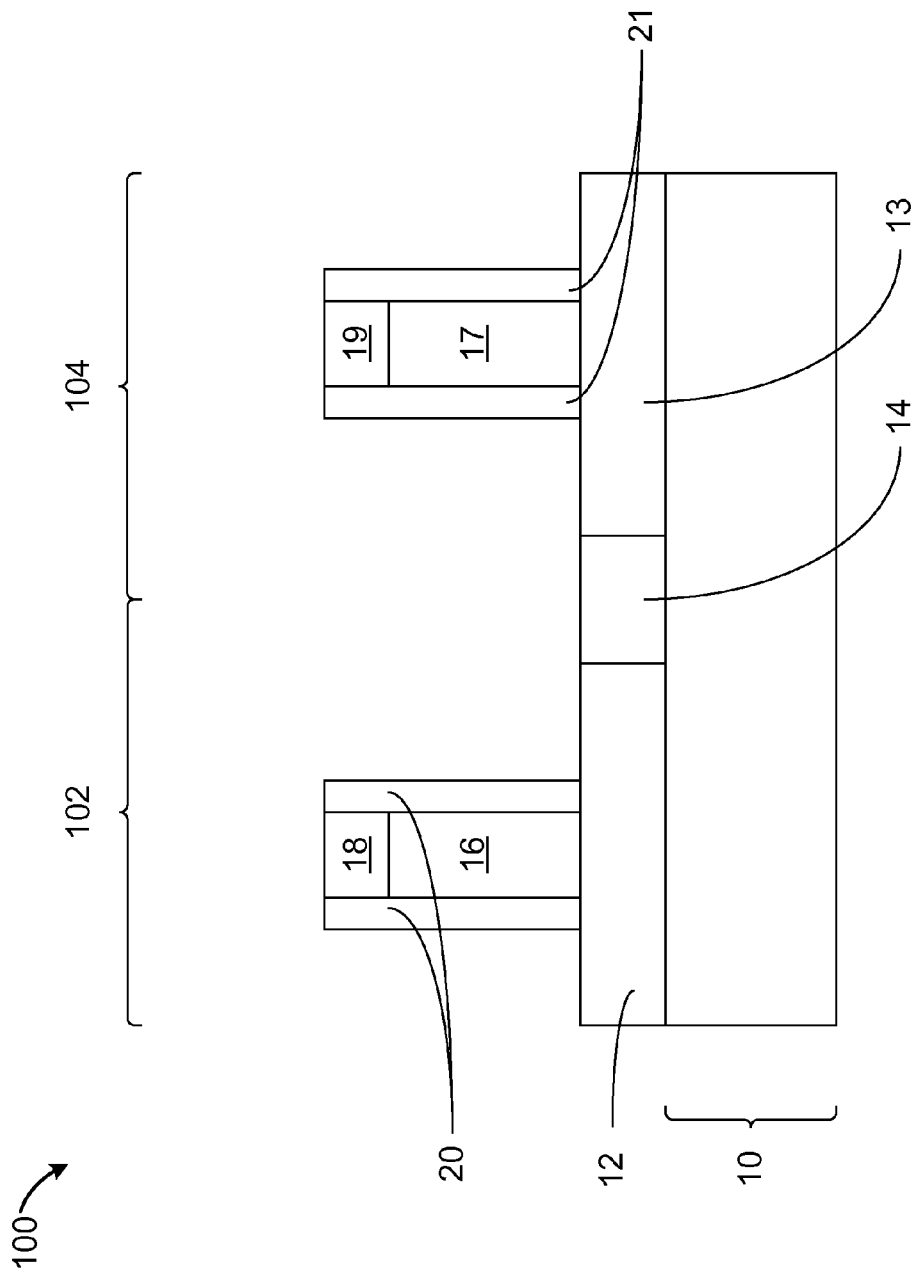
FIG. 1 is a cross-sectional view of a semiconductor structure depicting a p-type field effect transistor (pFET) and an n-type field effect transistor (nFET), according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A FinFET device may include a plurality of fins formed in a wafer; a gate covering a portion of the fins, where the portion of the fins covered by the gate serves as a channel region of the device and portions of the fins extending out from under the gate may serve as source and drain regions of the device; and a pair of sidewall spacers on opposite sides of the gate. It should be noted that the invention disclosed below may be fabricated using either a replacement gate or gate last process flow, or a gate first process flow. A replacement gate process flow will be relied on for the description provided below.

In a replacement gate (RG) fabrication approach, a semiconductor substrate may be patterned and etched to form fins. Next, a dummy gate may be formed in a direction perpendicular to the length of the fins. For example, the dummy gate may be pattered and etched from a polysilicon layer. A pair of sidewall spacers can be disposed on opposite sidewalls of the dummy gate. The dummy gates and the pair of sidewall spacers may then be surrounded by an inter-level dielectric. Later, the dummy gate may be removed from between the pair of sidewall spacers, as by, for example, an anisotropic vertical etch process such as a reactive ion etch (RIE). This creates an opening between the pair of sidewall spacers where a metal gate may then be formed between the pair of sidewall spacers. Optionally, a gate dielectric may be configured below the metal gate.

The present invention generally relates to semiconductor manufacturing, and more particularly to complementary metal-oxide-semiconductor (CMOS) n-type field effect transistor (nFET) and p-type field effect transistor (pFET) having equal spacer widths or lateral thicknesses. The pFET may also be referred to as a pFET device. The nFET may also be referred to as an nFET device. Forming FinFETs with comparable spacer widths or lateral thicknesses for both the nFET and pFET devices may be accomplished by protecting the nFET to grow epitaxy in the source drain regions of the pFET device, and then protecting the pFET device to grow epitaxy in the source drain regions of the nFET device. One embodiment by which to fabricate nFET and pFET comparable spacer widths or lateral thicknesses is described in detail below by referring to the accompanying drawings in FIGS. 1-14, in accordance with an illustrative embodiment.

Referring now to FIG. 1, a FinFET semiconductor structure 100 (hereinafter "structure") is shown according to an exemplary embodiment. The structure 100 may include a substrate 10 with a p-type field effect transistor 102 (hereinafter "pFET") and an n-type field effect transistor 104 (hereinafter "nFET") fabricated on the substrate 10. The pFET 102 may also be referred to as a pFET device. The nFET 104 may also be referred to as an nFET device. A shallow trench isolation 14 (hereinafter "STI") may be formed in the substrate 10, between the pFET 102 and the nFET 104, which may isolate the pFET 102 and the nFET 104 from one another. The pFET 102 may include a fin structure 12 (hereinafter "fin"), a pFET dummy gate 16 (hereinafter "dummy gate"), a pFET gate cap 18 (hereinafter "gate cap") and a set of pFET sidewall spacers 20 (hereinafter "spacers"). The nFET 104 may include a fin structure 13 (hereinafter "fin"), an nFET dummy gate 17 (hereinafter "dummy gate"), an nFET gate cap 19 (hereinafter "gate cap") and a set of nFET sidewall spacers 21 (hereinafter "spacers"). It may be noted that the figures generally illustrate a cross-sectional view of the structure parallel to the fins 12, 13 and perpendicular to the dummy gates 16, 17.

The structure 100 may be formed or provided. At this step of the manufacturing process, the fins 12, 13 may be formed from the substrate 10 according to techniques known in the art. The substrate 10 may be a bulk substrate (as shown in FIG. 1), which may be made from any of several known semiconductor material such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. In other embodiments, the substrate 10 may be, for example, a semiconductor-on-insulator (SOI) substrate, where a buried insulator layer separates a base substrate from a top semiconductor layer. In such cases, components of the structure 100, including the fins 12, 13 may be formed in or from the top semiconductor layer of the SOI substrate.

The fins 12, 13 may be formed from the substrate 10 using known photolithography and etch processes. In an exemplary embodiment, the fins 12, 13 may be formed using a sidewall image transfer (SIT) technique. In an embodiment in which the fins 12,13 may be formed from a bulk semiconductor substrate, the fins 12,13 may be isolated from one another by regions of dielectric material such as, for example, the STI 14. The STI 14 may be formed using known deposition and patterning techniques. The top surface of the STI 14 may be lower than a top surface of the fins 12, 13 or a top surface of the source drain regions. It should be noted that, while the embodiment depicted in the figures includes two fins 12, 13, any number of fins may be formed from the substrate 10.

In an embodiment, the dummy gate 16 may be formed over a portion of the fin 12 in the structure 100. A gate cap 18 may be formed over the dummy gate 16. A portion of the fin 12 covered by the dummy gate 16 may be referred to as a pFET channel region. The dummy gate 17 may be formed over a portion of the fin 13 in the structure 100. A gate cap 19 may be formed over the dummy gate 17. A portion of the fin 13 covered by the dummy gate 17 may be referred to as an nFET channel region. The portions of the fins 12, 13 not covered by the dummy gates 16, 17 may be referred to as source drain regions. The dummy gates 16, 17 and the gate caps 18, 19, may be formed using known patterning and etching techniques. For example, a blanket layer of a sacrificial material may first be deposited above the structure 100. The sacrificial material may include any suitable silicon or polysilicon able to be selectively removed. In an embodiment, the sacrificial material may include amorphous silicon. In an embodiment, the sacrificial material and may be deposited using typical deposition techniques, for example, atomic layer deposition (ALD), molecular layer deposition (MLD), chemical vapor deposition (CVD), physical vapor deposition (PVD), and spin on techniques. In an embodiment, the sacrificial material may have a vertical thickness, or height, covering fins 12, 13 ranging from about 80 nm to about 150 nm, and ranges there between. It should be noted that the vertical thickness of the sacrificial material may correspond to the height of the dummy gates 16, 17 which may be subsequently patterned from the sacrificial material. In some embodiments, a thin layer of dummy oxide (not shown) may be deposited prior to depositing the sacrificial material. In an embodiment, the gate caps 18,19 may include silicon nitride ($Si_3N_4$), SiBCN, SiOC or any combination of these materials, deposited using a chemical vapor deposition technique. In an embodiment, the gate caps 18, 19 may have a thickness ranging from about 10 nm to about 50 nm and ranges there between, although a thickness less than 10 nm and greater than 50 nm may be acceptable. It should be noted that, while the embodiment depicted in the figures includes two dummy gates 16, 17, and two gate caps 18, 19 any number of dummy gates and gate caps may be on the substrate 10.

The spacers 20, 21 may be formed on opposite sidewalls of the dummy gates 16, 17 and the gate caps 18, 19, according to an exemplary embodiment. The spacers 20,21 may be formed by conformally depositing or growing a dielectric, followed by an anisotropic etch that removes the dielectric from the horizontal surfaces of the structure 100, while leaving it on the sidewalls of the dummy gates 16,17 and the gate caps 18,19. In an embodiment, the spacers 20, 21 may include any dielectric material such as silicon nitride (Si3N4), SiBCN, SiOC, low-k dielectric or any combination of these materials. The spacers 20, 21 may include a single layer; however, the spacers 20, 21 may include multiple layers of dielectric material. A portion of the spacers 20, 21 on opposite sidewalls of the dummy gates 16, 17 may be referred to as dummy gate spacers. The dummy gate spacers may serve to insulate the gate from the source drain region.

Figure 2:
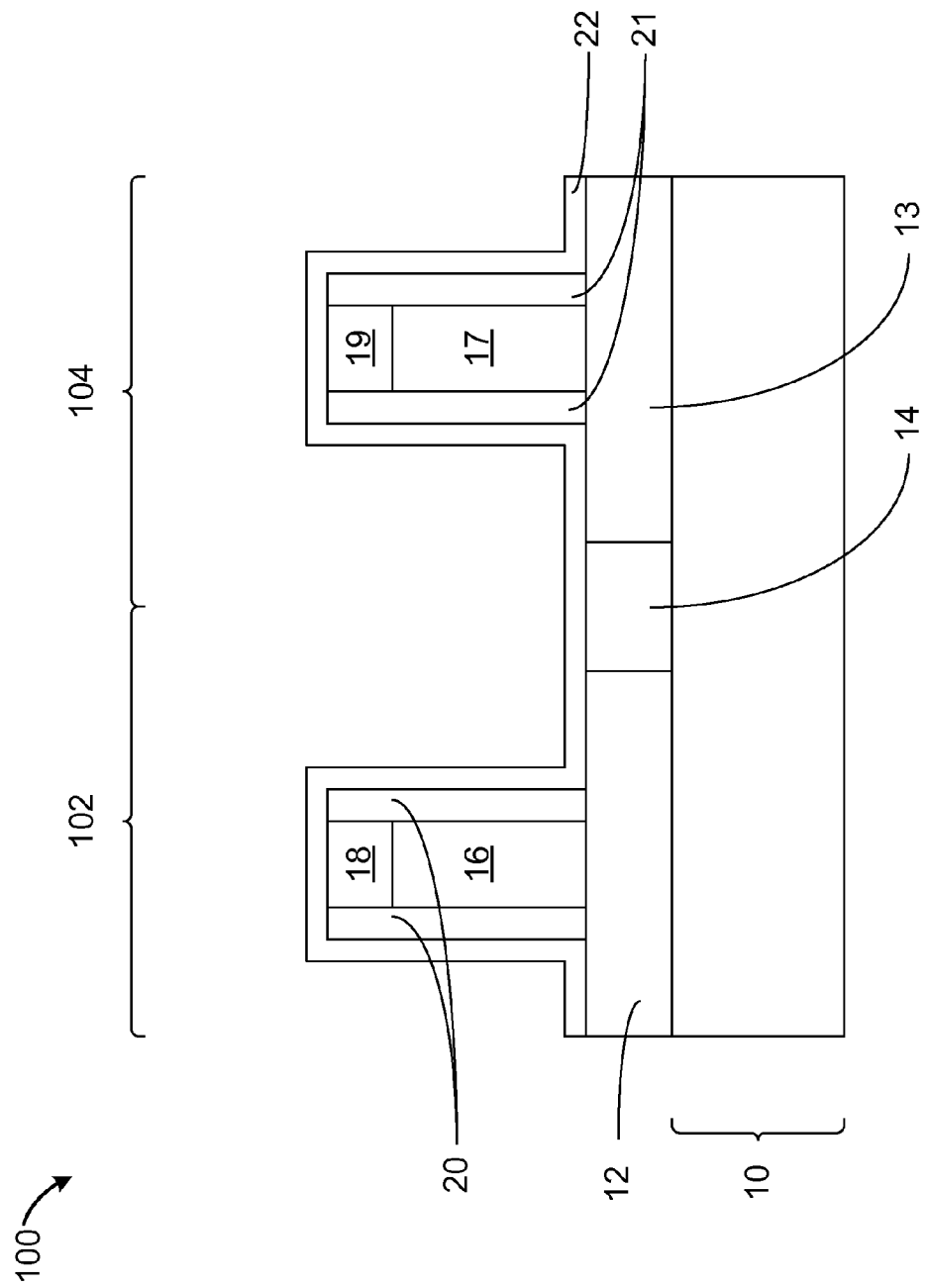
FIG. 2 is a cross-sectional view of a semiconductor structure depicting the formation of a first liner, according to an exemplary embodiment.

Referring now to FIG. 2, a first liner 22 may be deposited uniformly over the exposed surfaces of the structure 100. More specifically, the first liner 22 may be conformally deposited on top of the exposed areas of the fins 12, 13, the STI 14, the gate caps 18, 19 and the spacers 20, 21. The first liner 22 may include an oxide or a silicon. The first liner 22 be deposited using typical deposition techniques, for example, atomic layer deposition (ALD), molecular layer deposition (MLD), chemical vapor deposition (CVD), physical vapor deposition (PVD), and spin on techniques. The first liner 22 may have a thickness ranging from about 1 nm to about 10 nm, although a thickness less than 1 nm and greater than 10 nm may be acceptable. In an embodiment, the first liner 22 may be about 3 nm thick. The first liner 22 may preferably be thick enough to be used as an etch stop in subsequent pattern and etch techniques as described below. In an alternate embodiment, the first liner 22 can be formed by deposition of a liner containing metal, such as hafnium oxide (HfO2), titanium nitride (TiN), or tantalum oxide (TaOx) by chemical vapor deposition (CVD) or atomic layer deposition (ALD).

Figure 3:
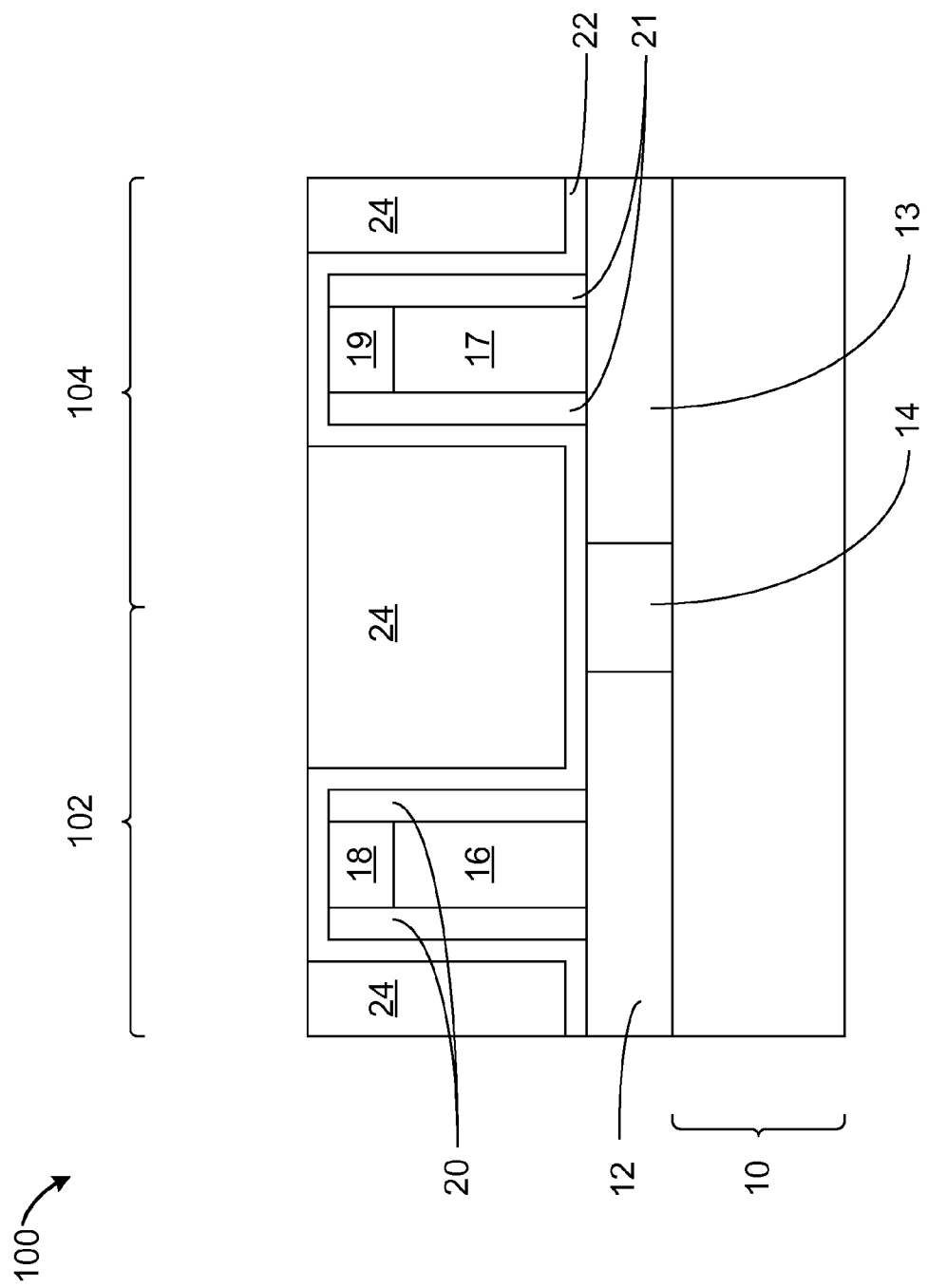
FIG. 3 is a cross-sectional view of a semiconductor structure depicting the formation of a fill material, according to an exemplary embodiment.

Referring now to FIG. 3, a fill material 24 may be deposited on the surface of the structure 100 over the first liner 22. The fill material 24 may include any material that may function as a mask to protect underlying structures during subsequent deposition and etching techniques. In an embodiment the fill material 24 may include amorphous silicon. In embodiments in which amorphous silicon is used, the fill material 24 may be deposited using typical deposition techniques, for example, atomic layer deposition (ALD), molecular layer deposition (MLD), chemical vapor deposition (CVD), physical vapor deposition (PVD), and spin on techniques. The fill material 24 may be polished using a chemical mechanical polishing (CMP) technique until a top surface of the fill material 24 is substantially coplanar with a top surface of the first liner 22, directly above the dummy gates 16,17, as illustrated.

In an alternate embodiment where the first liner 22 contains metal, the fill material 24 may preferably be a dielectric material such as an oxide, nitride, oxynitride, silicon carbon oxynitride, silicon boron oxynitride, low-k dielectric, or any combination thereof.

Figure 4:
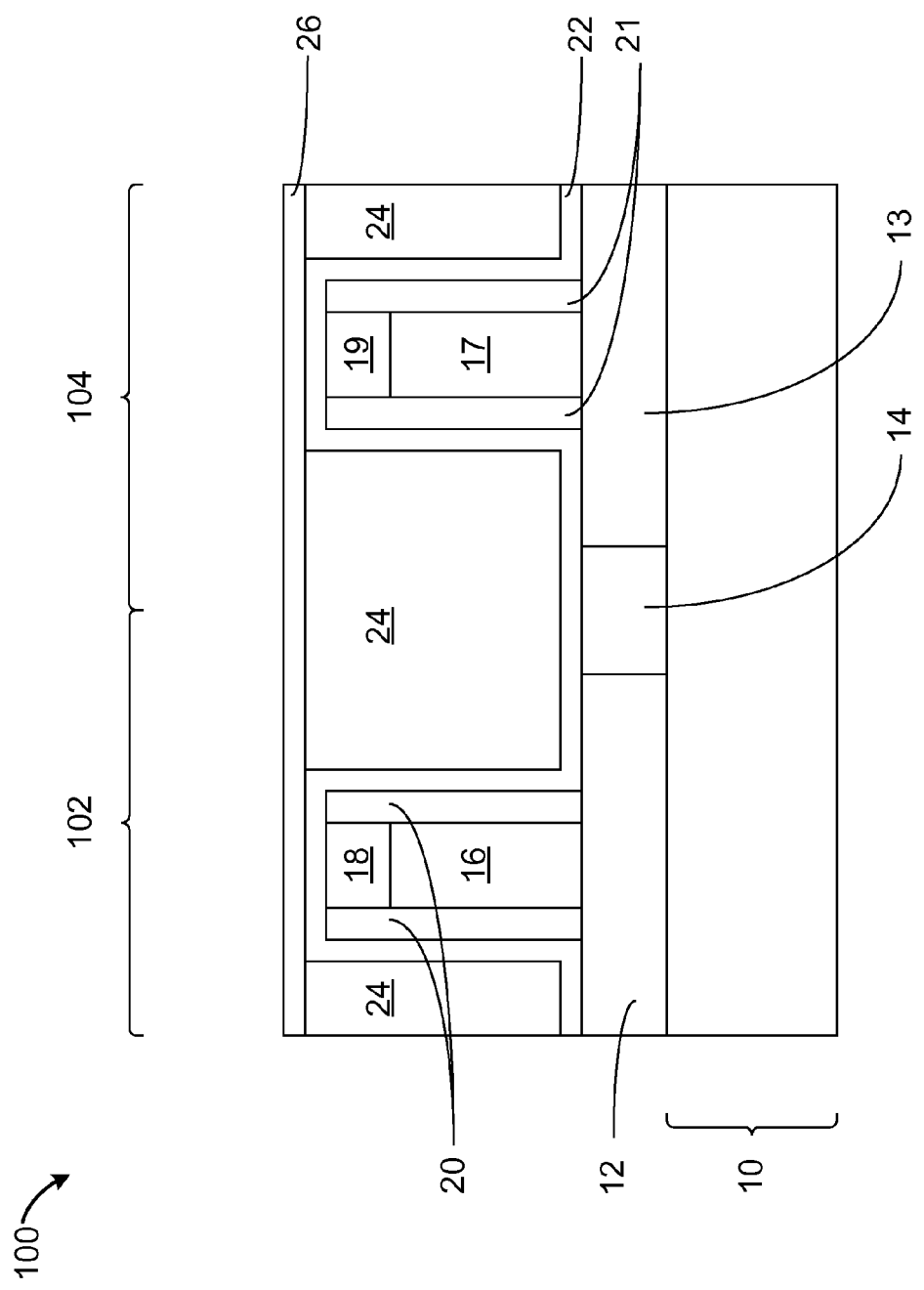
FIG. 4 is a cross-sectional view of a semiconductor structure depicting the formation of a cap layer, according to an exemplary embodiment.

Referring now to FIG. 4, a cap layer 26, may be formed on top of the structure 100 on the fill material 24 and the first liner 22. The cap layer 26 may be deposited using typical deposition techniques, for example, atomic layer deposition (ALD), molecular layer deposition (MLD), chemical vapor deposition (CVD), physical vapor deposition (PVD), and spin on techniques. The cap layer 26 may include, for example, silicon nitride, silicon oxynitride, boron nitride, or any suitable combination of those materials. The nitride layer may be formed using conventional deposition methods, for example, low-pressure chemical vapor deposition (LPCVD). In an exemplary embodiment, the cap layer 26 may have a thickness ranging from approximately 3 nm to approximately 50 nm. The cap layer 26 may be used as an etch stop in subsequent pattern and etch techniques as described below.

Figure 5:
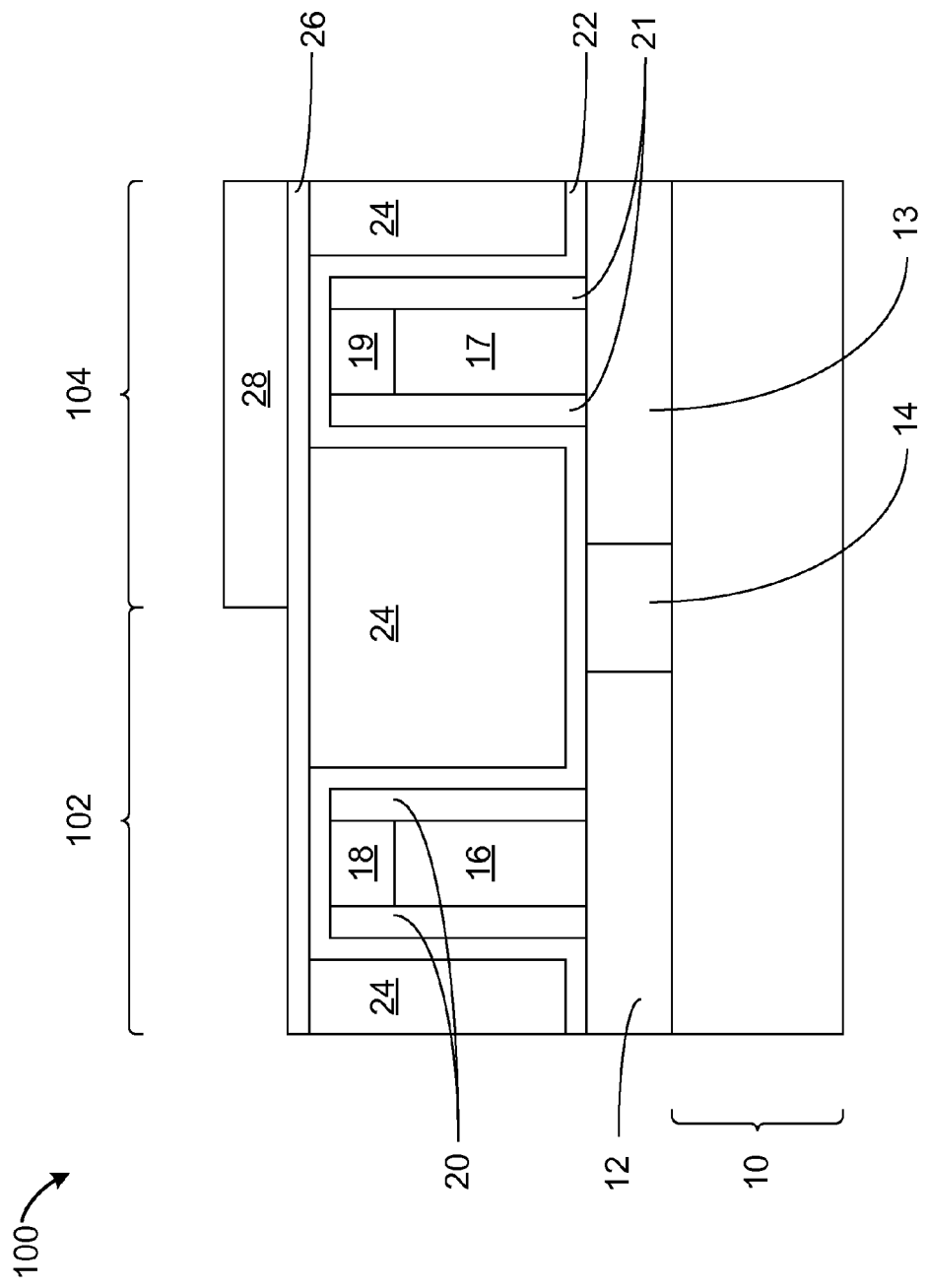
FIG. 5 is a cross-sectional view of a semiconductor structure depicting the formation of a first photo resist, according to an exemplary embodiment.

Referring now to FIG. 5, a first photo resist 28 is deposited across the structure 100 over the cap layer 26, using known techniques. More specifically, the first photo resist 28 is patterned such that it will cover only the nFET 104. The first photo resist 28 over the nFET 104 may allow further processing of the pFET 102 while protecting the nFET 104.

Figure 6:
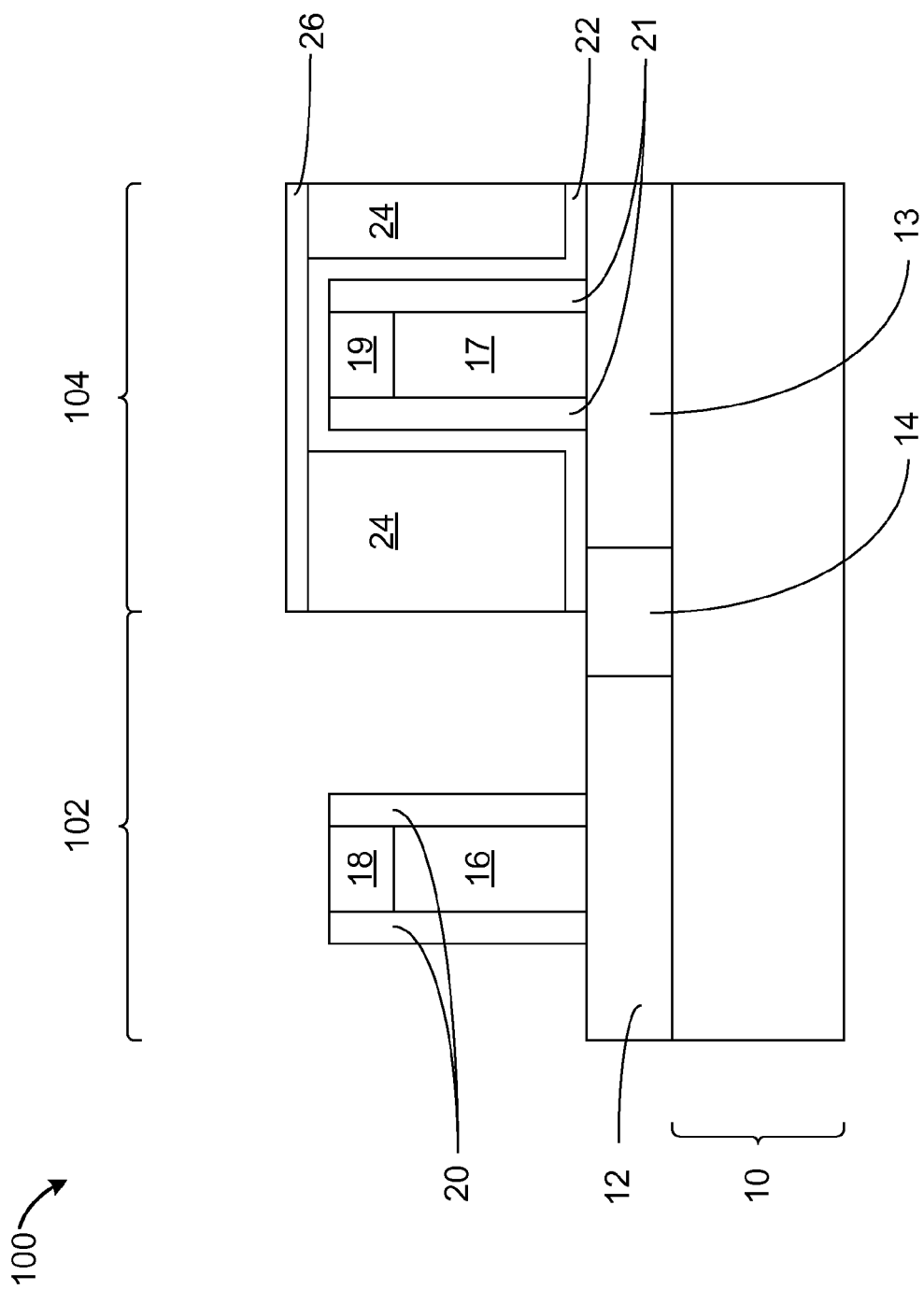
FIG. 6 is a cross-sectional view of a semiconductor structure depicting the partial removal of the cap layer, the partial removal of the fill material and the partial removal of the first liner, according to an exemplary embodiment.

Referring now to FIG. 6, a portion of the cap layer 26 above the pFET 102, a portion of the fill material 24 above the pFET 102 and a portion of the first liner 22 above the pFET 102 may be removed by means of any etching technique known in the art. For example, etching techniques may be used such as reactive ion etching (RIE) or a wet chemical etching process. In some embodiments, the etching process may be self-aligned, using first the photo resist 28 to define the area of the pFET 102. In other embodiments, photolithography may be used to define the portion of the substrate 10 to be etched. The etching technique may be performed in one or more steps utilizing any combination of the above methods. The removal of these layers above the pFET 102 may allow further processing of the pFET 102 while protecting the nFET 104. Finally, after removing the portion of the cap layer 26, the portion of the fill material 24 and the portion of the liner 22 from above the pFET, the first photo resist 28 above the nFET 104 may be removed. This may be done in one or more steps.

In an alternate embodiment where the first liner 22 contains metal and the fill material 24 contains a dielectric material, the first liner 22 may be removed with a Carina Etch or Standard Clean 1 (SC1). The etching technique utilized must have high selectivity to spacers 20.

Figure 7:
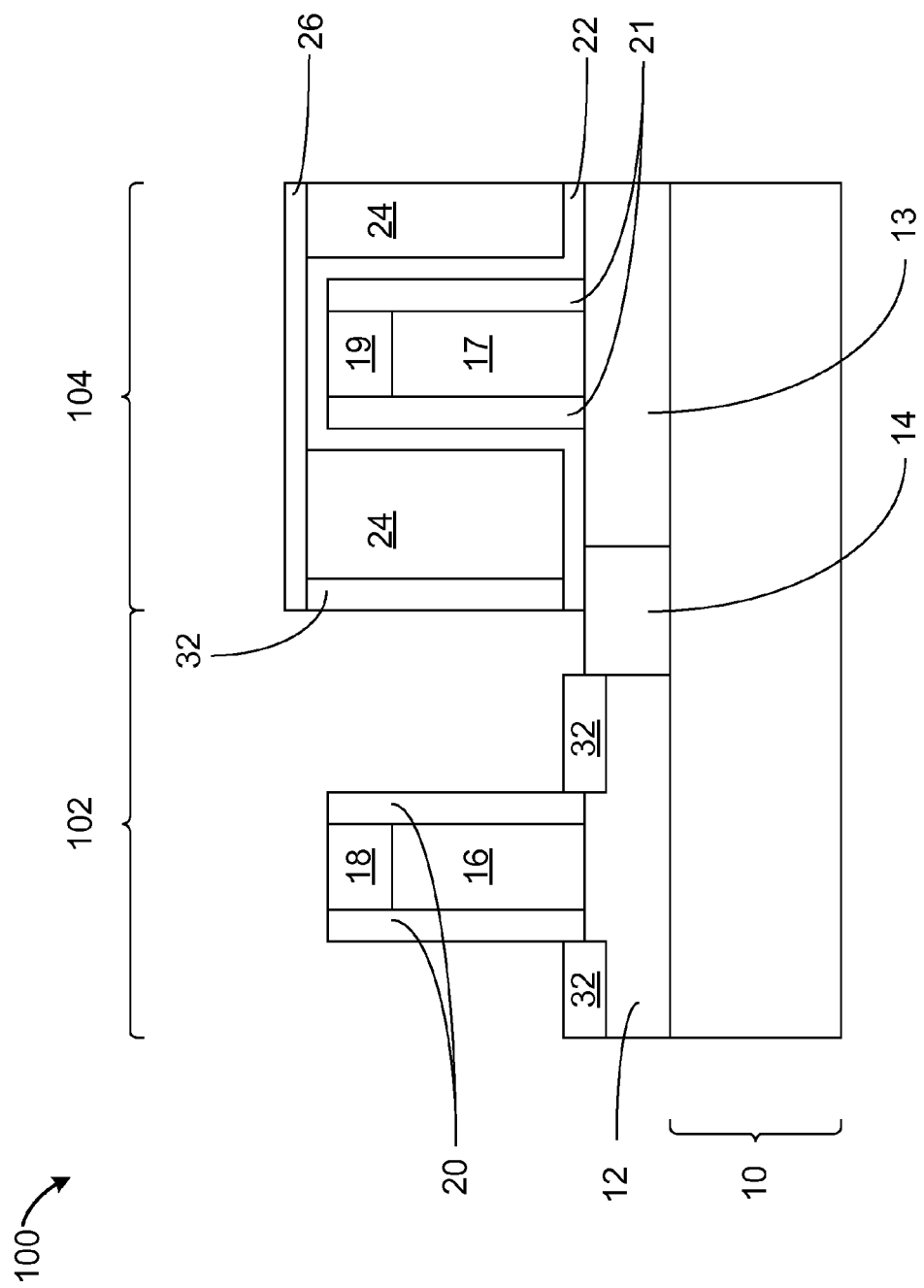
FIG. 7 is a cross-sectional view of a semiconductor structure depicting the formation of a first epitaxy, according to an exemplary embodiment.

Referring now to FIG. 7, a first epitaxy 32 may be formed by growing an epitaxy in the exposed portion of the fin 12. For the pFET 102, the first epitaxy 32 may be made of a silicon-germanium alloy or any intrinsic or doped semiconductor material for pFET source drain. Examples of various epitaxial growth techniques used in forming the first epitaxy 32 may include, for example, rapid thermal chemical vapor deposition, low energy cluster beam deposition, ultra high vacuum chemical vapor deposition, and atmospheric pressure chemical vapor deposition. In an embodiment when the fill material 24 is amorphous silicon, the first epitaxy 32 may be formed on the exposed sidewall of the fill material 24. In this embodiment, the first epitaxy 32 may be removed from the exposed sidewall of the fill material 24 area in subsequent process steps.

In an alternate embodiment where the liner 22 contains a metal and the fill material 24 contains a dielectric material, the first epitaxy 32 may not form on the exposed sidewall of the fill material 24 in the area of the nFET 104.

Figure 8:
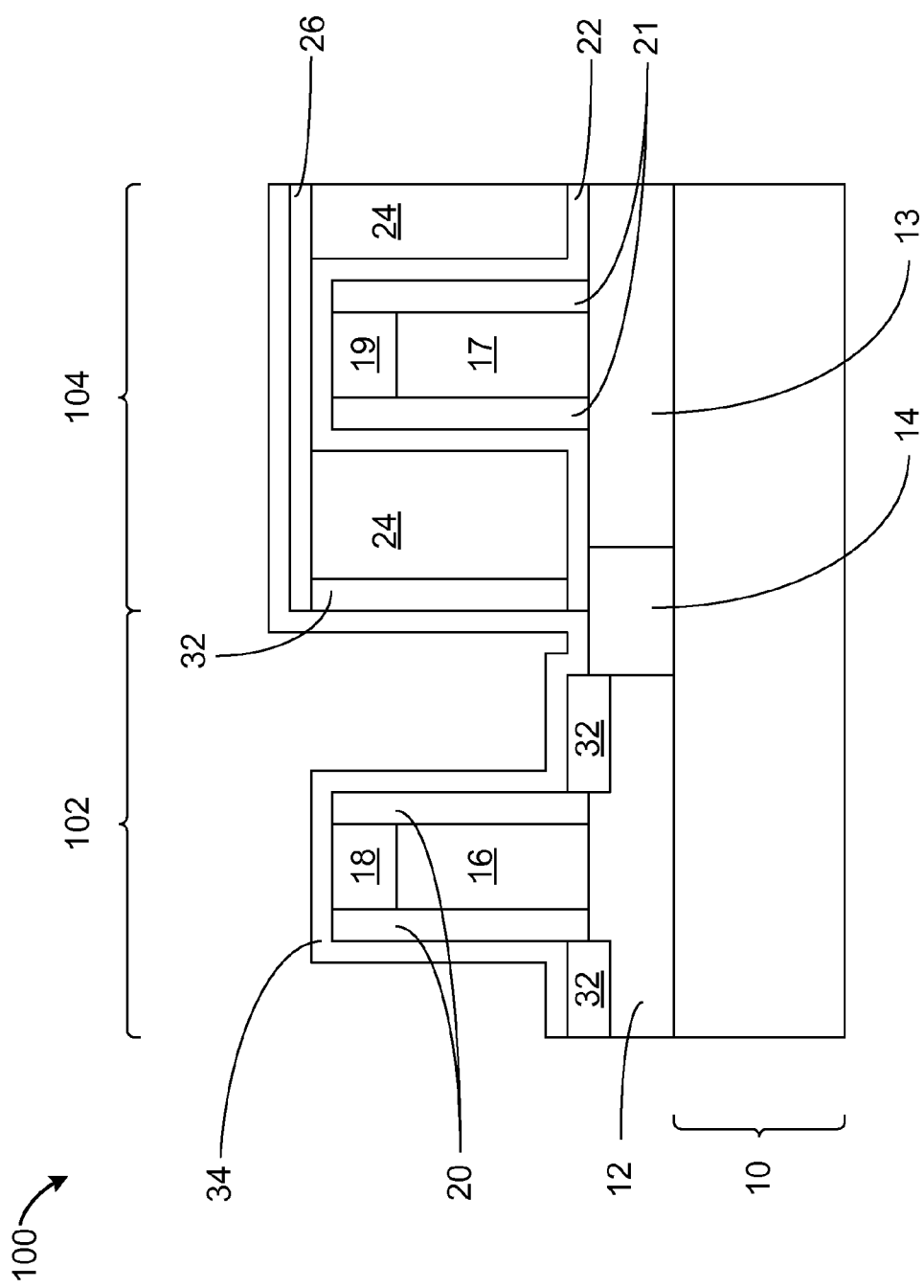
FIG. 8 is a cross-sectional view of a semiconductor structure depicting the formation of a second liner, according to an exemplary embodiment.

Referring now to FIG. 8, a second liner 34, may be deposited uniformly over the exposed surfaces of the structure 100. More specifically, the second liner 34 may be conformally deposited on top of the remaining portion of the cap layer 26 in the area of the nFET 104. The second liner 34 may cover the first epitaxy 32, a portion of the STI 14, the gate cap 18 and the spacers 20. The second liner 34 may include any dielectric material known in the art, for example, a nitride. In an embodiment, the second liner 34 may also be deposited using typical deposition techniques, for example, atomic layer deposition (ALD), molecular layer deposition (MLD), chemical vapor deposition (CVD), physical vapor deposition (PVD), and spin on techniques. In an embodiment, the second liner 34 may include silicon nitride (Si3N4) deposited using a chemical vapor deposition technique. In an embodiment, the second liner 34 may have a thickness ranging from about 3 nm to about 10 nm and ranges there between, although a thickness less than 3 nm and greater than 10 nm may be acceptable. In an embodiment, the second liner 34 may be about 5 nm thick. The second liner 34 may be used as an etch stop in subsequent pattern and etch techniques as described below.

Figure 9:
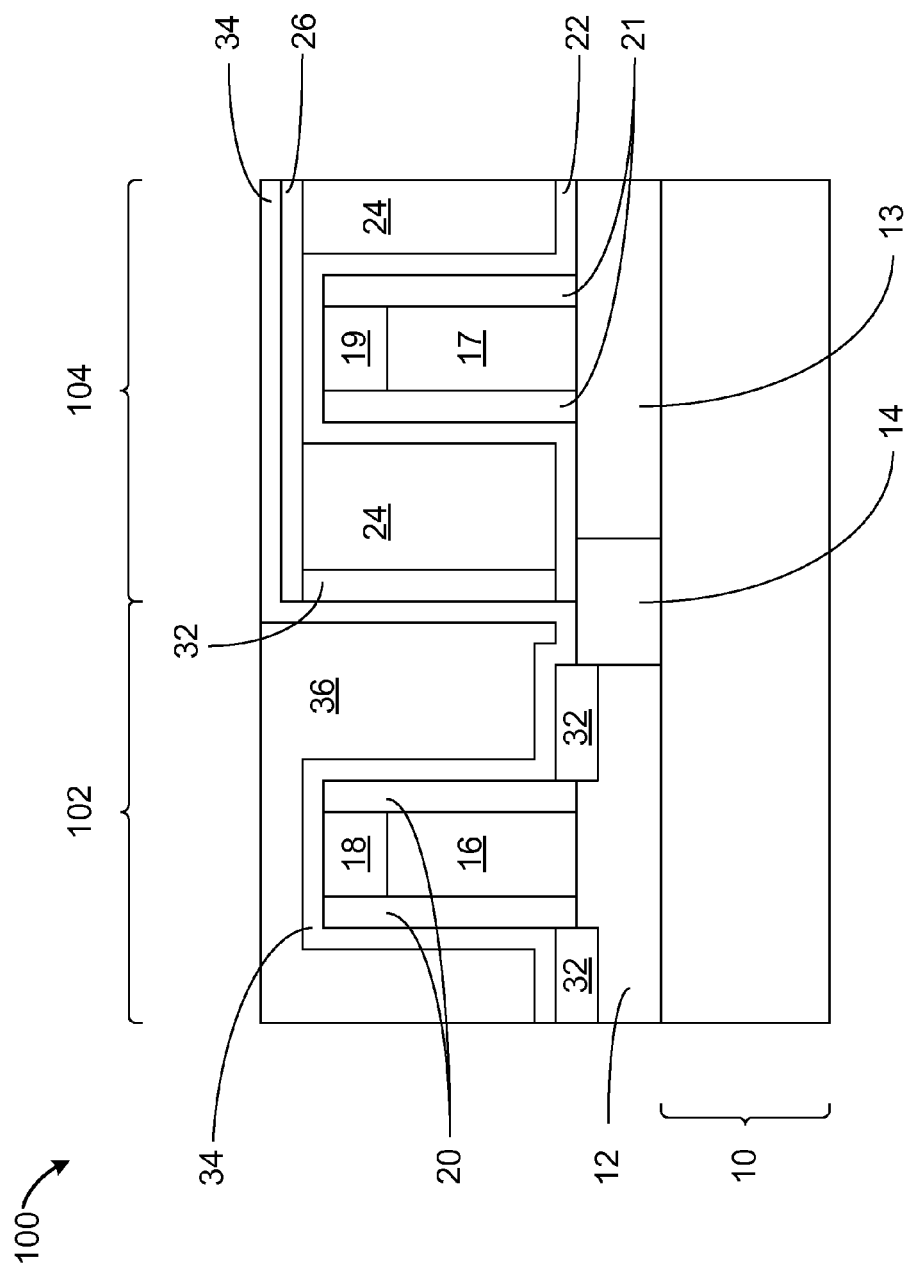
FIG. 9 is a cross-sectional view of a semiconductor structure depicting the formation of a first inter level dielectric, according to an exemplary embodiment.

Referring now to FIG. 9, a first inter level dielectric layer 36 may be formed directly on the exposed top surfaces of the structure 100, according to an exemplary embodiment. The first inter level dielectric layer 36 may be made from an insulator material such as an oxide, nitride, oxynitride, silicon carbon oxynitride, silicon boron oxynitride, low-k dielectric, or any combination thereof. The first inter level dielectric layer 36 may be deposited using typical deposition techniques, for example, atomic layer deposition (ALD), molecular layer deposition (MLD), chemical vapor deposition (CVD), physical vapor deposition (PVD), and spin on techniques. The first inter level dielectric layer 36 may be planarized until a top portion of the second liner 34 is exposed. A chemical mechanic polishing (CMP) may be performed until the first inter level dielectric layer 36 may be substantially coplanar with the top portion of the second liner 34. Stated differently, the CMP technique may be performed until a top surface of the first inter level dielectric layer 36 is substantially flush with a top surface of the exposed portion of the second liner 34.

Figure 10:
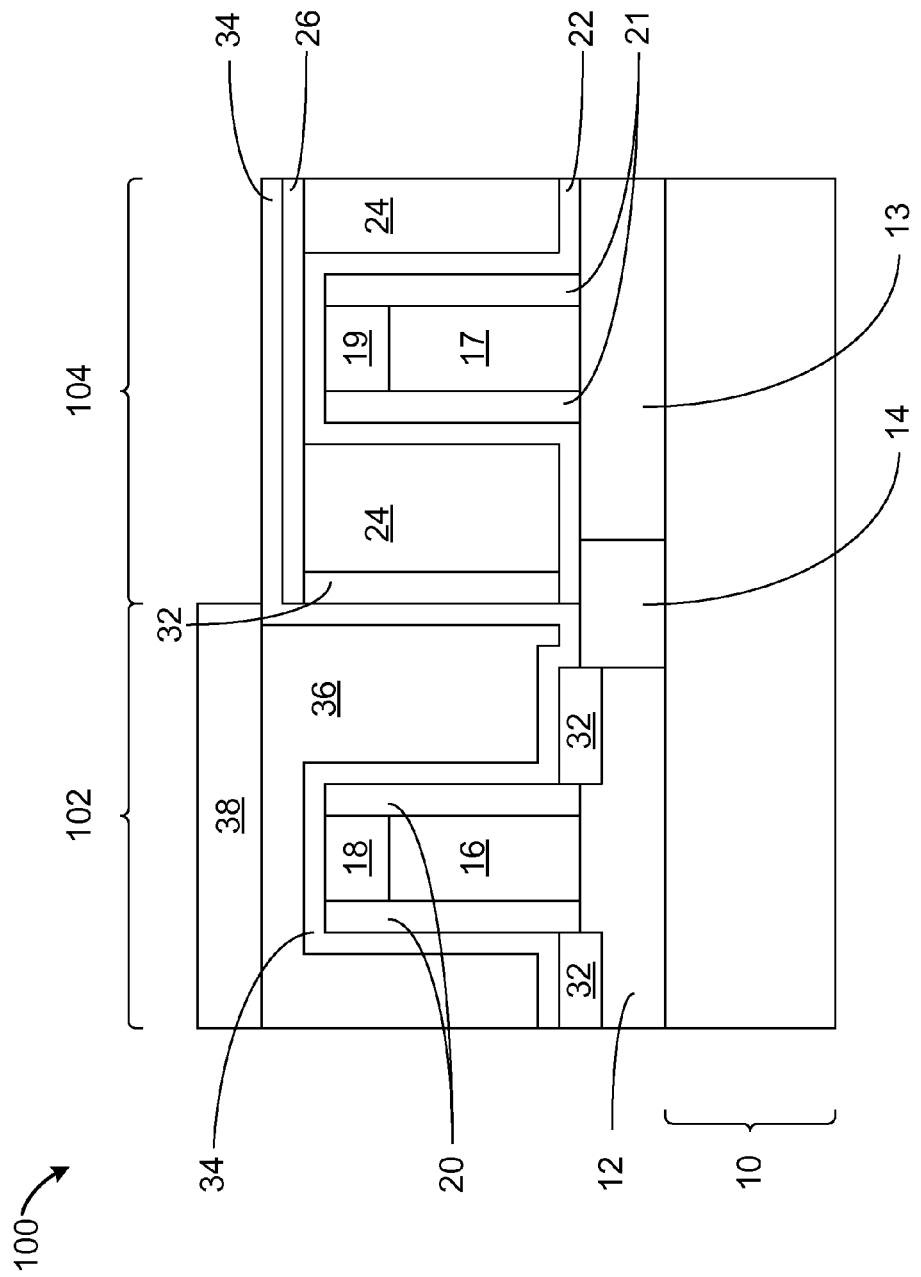
FIG. 10 is a cross-sectional view of a semiconductor structure depicting the formation of a second photo resist, according to an exemplary embodiment.

Referring now to FIG. 10, a second photo resist 38 may be deposited on the structure 100 over the first inter level dielectric 36, using known techniques. More specifically, the second photo resist 38 is patterned such that it will cover the area of the pFET 102. The second photo resist 38 over the pFET 102 may allow further processing in the nFET 104 while protecting the pFET 102.

Figure 11:
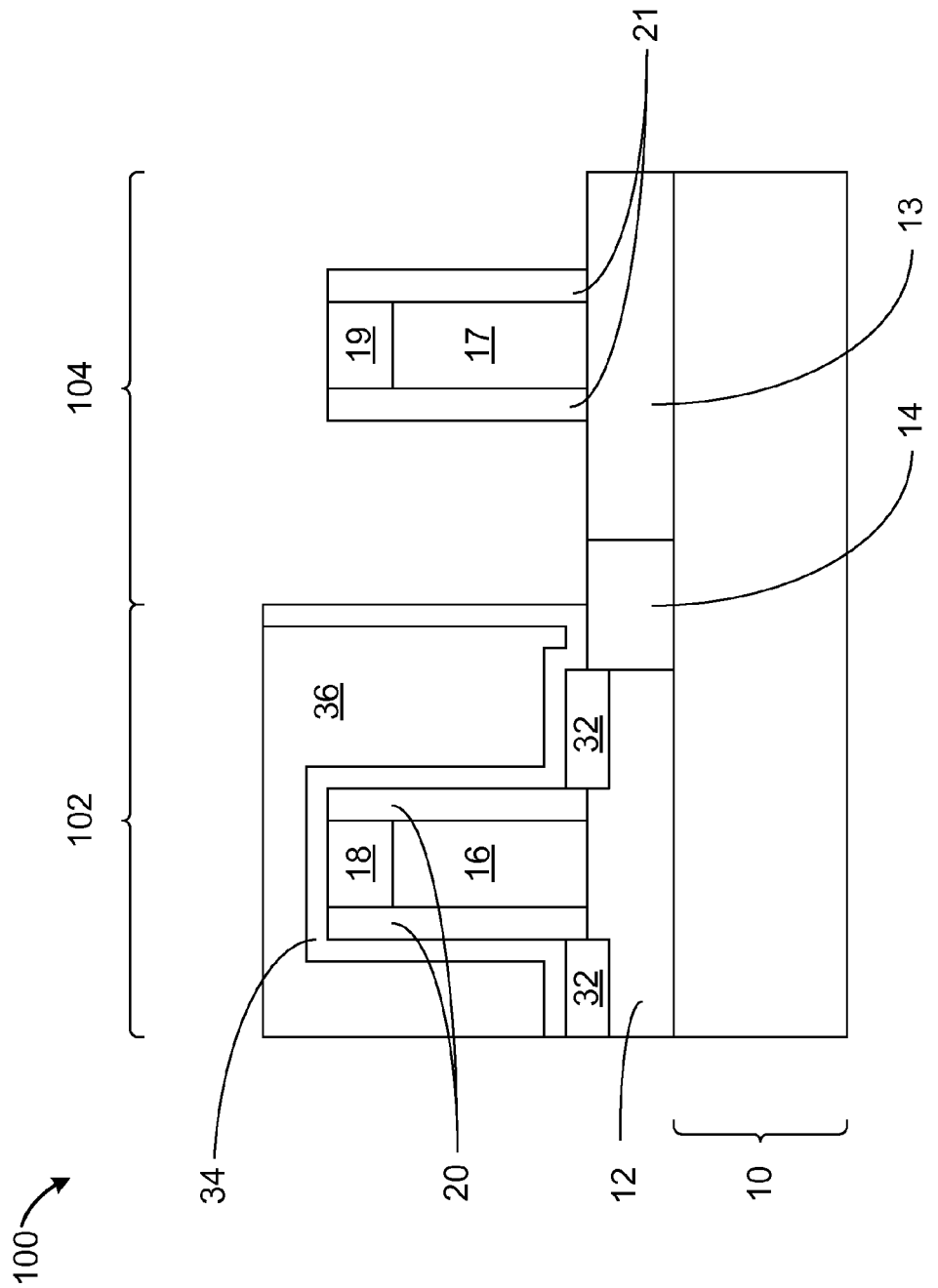
FIG. 11 is a cross-sectional view of a semiconductor structure depicting partial removal of the second liner, the removal of a remainder of the cap layer, the partial removal of the first epitaxy, the removal of a remainder of the fill material, the removal of a remainder of the first liner and the removal of the second photo resist, according to an exemplary embodiment.

Referring now to FIG. 11, a portion of the second liner 34 in the area of the nFET 102, a remainder of the cap layer 26, a remainder of the fill material 24, a portion of the first epitaxy 32 in the area of the nFET 104 and a remainder of the first liner 22 may be removed by means of any etching technique known in the art. For example, etching techniques such as reactive ion etching (RIE) or a wet chemical etching process may be used. In some embodiments, the etching process may be self-aligned, using the second photo resist 38 to define the area of the nFET 104. In other embodiments, photolithography may be used to define the portion of the substrate 10 to be etched. The etching technique used may not remove any portion of the substrate 10. The etching technique may be performed in one or more steps utilizing any combination of the above methods. The removal of these layers above the nFET 104 may allow further processing of the nFET 104 while protecting the pFET 102 and the spacers 20. Finally, after removing the portion of the second liner 34 in the area of the nFET 102, the remainder of the cap layer 26, the remainder of the fill material 24, the portion of the first epitaxy 32 in the area of the nFET 104 and the remainder of the first liner 22, the second photo resist 38 above the pFET 102 may also be removed. This may be done in one or more steps.

In an alternate embodiment where the first liner 22 contains metal, the first liner 22 may be removed with a Carina Etch or Standard Clean 1 (SC1). The etching technique utilized must have high selectivity to the spacers 21.

Figure 12:
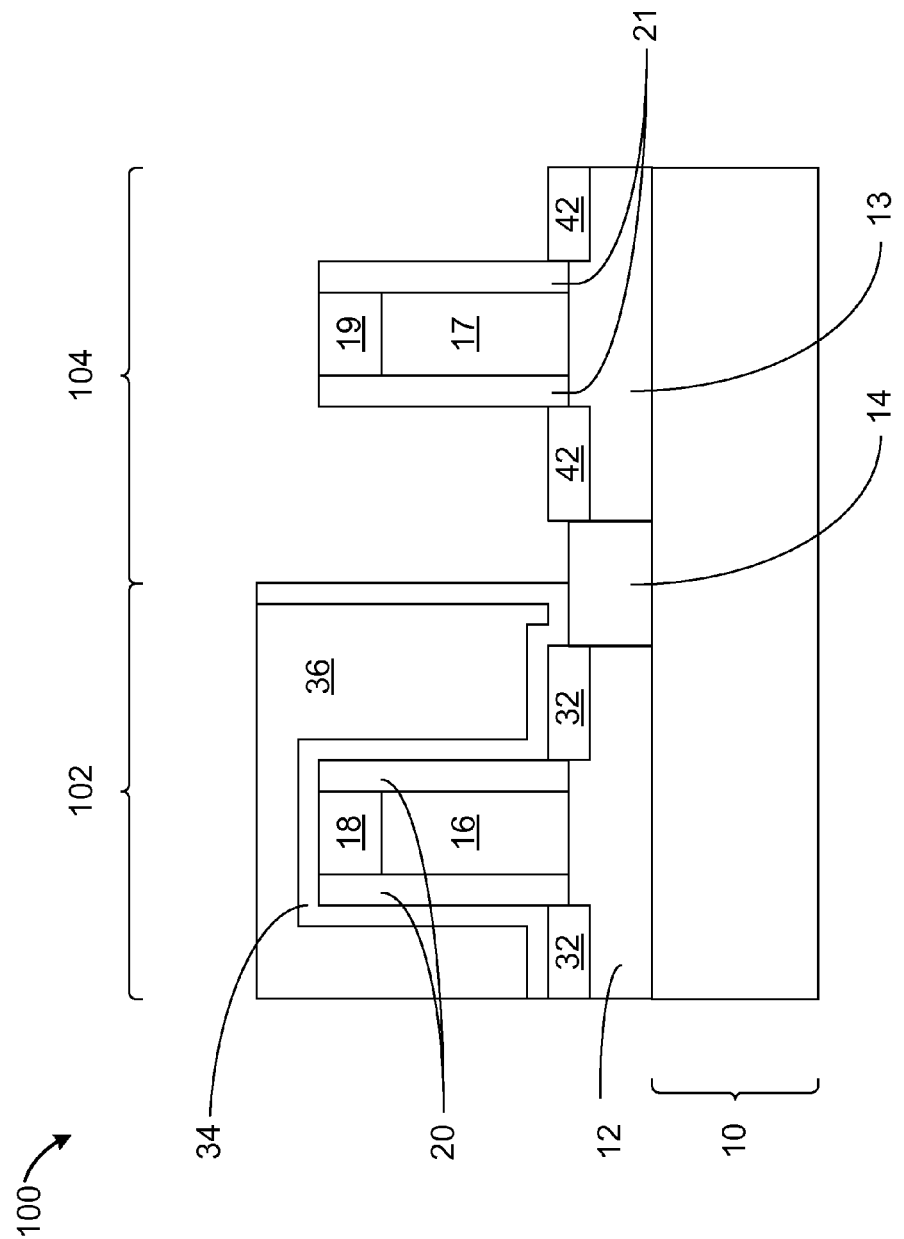
FIG. 12 is a cross-sectional view of a semiconductor structure depicting the formation of a second epitaxy, according to an exemplary embodiment.

Referring now to FIG. 12, a second epitaxy 42 may formed by growing an epitaxy in the exposed portion of the fin 13. For the nFET 104, the second epitaxy 42 may be made of silicon phosphorus doped with carbon alloy or any intrinsic or doped semiconductor material for nFET source drain. Examples of various epitaxial growth techniques used in forming the first epitaxy 32 may include, for example, rapid thermal chemical vapor deposition, low energy cluster beam deposition, ultra high vacuum chemical vapor deposition, and atmospheric pressure chemical vapor deposition.

Figure 13:
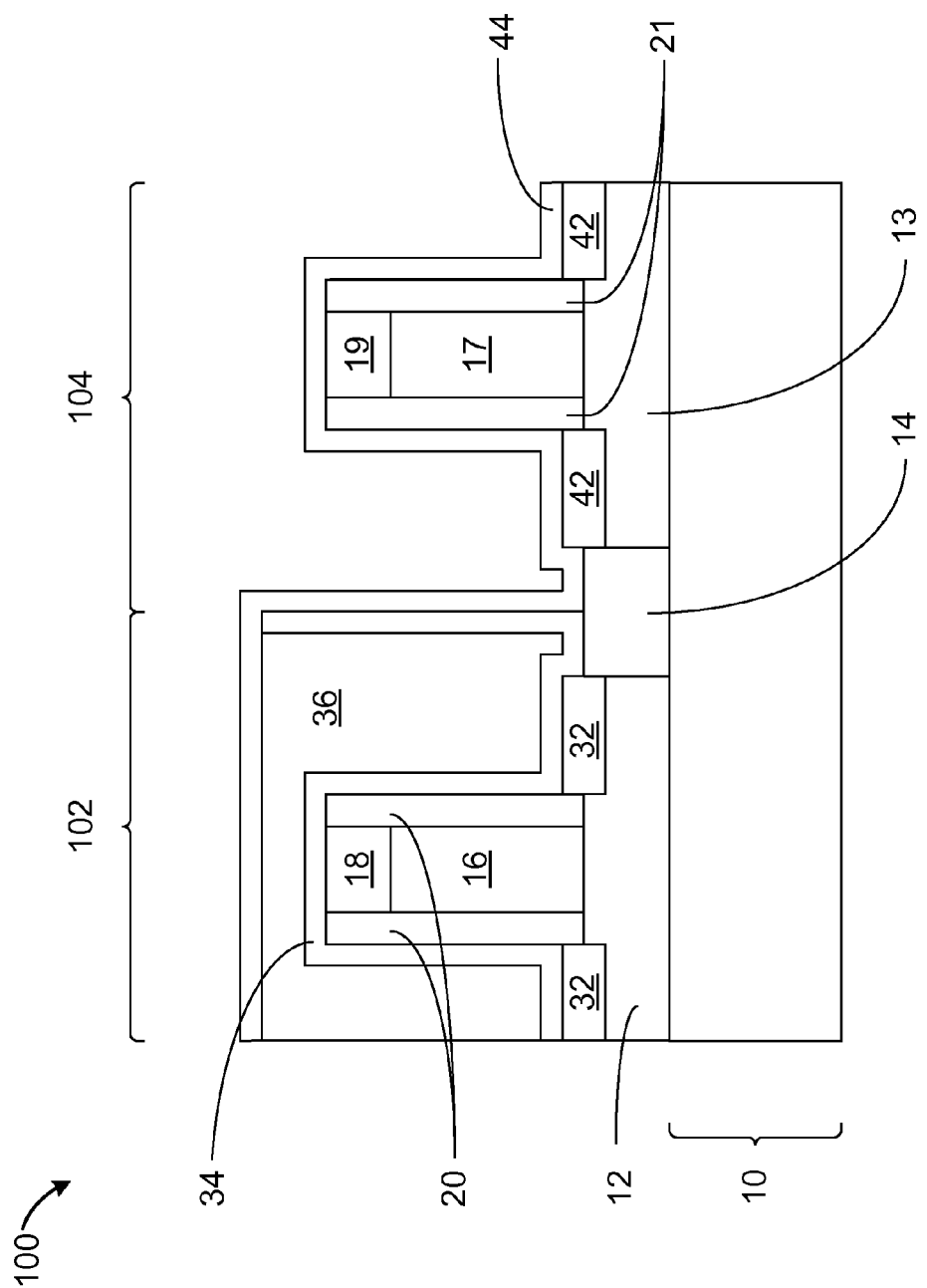
FIG. 13 is a cross-sectional view of a semiconductor structure depicting the formation of a third liner, according to an exemplary embodiment.

Referring now to FIG. 13, a third liner 44, may be deposited uniformly over the exposed surfaces of the structure 100. More specifically, the third liner 44 may be conformally deposited on a vertical portion of the second liner 34, the first inter level dielectric 36, a second portion of the STI 14, the second epitaxy 42, the gate cap 19 and the spacers 21. The third liner 44 may be in direct contact with the second liner 34 where each of the first liner and the second liner include substantially vertical portions located between the pFET 102 device and the nFET 104 device, where the substantially vertical portions of both the second liner 34 and the third liner 44 are in direct contact with one another. The third liner 44 may include any dielectric material known in the art, for example, a silicon nitride, SiBCN, SiOCN or any low-k dielectric. In an embodiment, the third liner 44 may also be deposited using typical deposition techniques, for example, atomic layer deposition (ALD), molecular layer deposition (MLD), chemical vapor deposition (CVD), physical vapor deposition (PVD), and spin on techniques. In an embodiment, the third liner 44 may include silicon nitride (Si3N4) deposited using a chemical vapor deposition technique. In an embodiment, the third liner 44 may have a thickness ranging from about 3 nm to about 10 nm and ranges there between, although a thickness less than 3 nm and greater than 10 nm may be acceptable. The third liner 44 may then be patterned from the blanket layer by any lithography technique known in the art. In an embodiment, the third liner 44 may be about 3 nm thick. The third liner 44 may be used as an etch stop in subsequent pattern and etch techniques.

Figure 14:
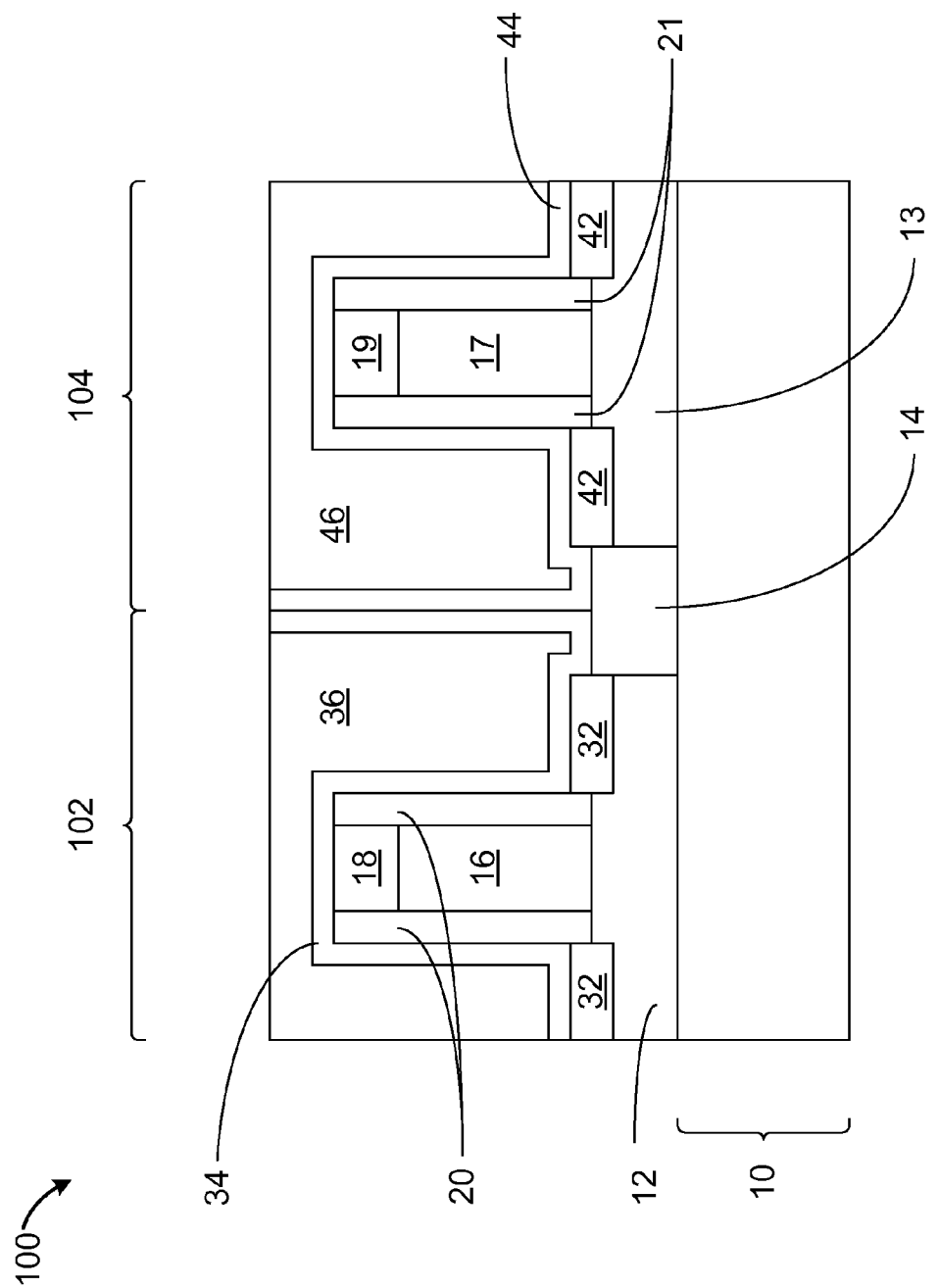
FIG. 14 is a cross-sectional view of a semiconductor structure depicting the partial removal of the third liner and the formation of a second inter level dielectric, according to an exemplary embodiment.

Referring now to FIG. 14, a second inter level dielectric layer 46 may be formed directly on the exposed top surfaces of the structure 100, according to an exemplary embodiment. The second inter level dielectric layer 46 may be made from an insulator material such as an oxide, nitride, oxynitride, silicon carbon oxynitride, silicon boron oxynitride, low-k dielectric, or any combination thereof. The second inter level dielectric layer 46 may be deposited using typical deposition techniques, for example, atomic layer deposition (ALD), molecular layer deposition (MLD), chemical vapor deposition (CVD), physical vapor deposition (PVD), and spin on techniques. The second inter level dielectric layer 46 may be planarized until a top portion of the first inter level dielectric 36 is exposed. A chemical mechanic polishing (CMP) may be conducted until the second inter level dielectric layer 46 may be substantially coplanar with the top portion of the first inter level dielectric 36. Stated differently, the CMP technique may be conducted until a top surface of the second inter level dielectric layer 46 is substantially flush with a top surface of an exposed portion of the first inter level dielectric 36. As shown in FIG. 14, a portion of the second liner 34 and a portion of the third liner 44 may be substantially flush with first inter level dielectric layer 36 and second inter level dielectric layer 46 and may form a barrier between first inter level dielectric layer 36 and second inter level dielectric layer 46.

Subsequent processing steps to finish fabrication of the pFET 102 and the nFET 104 may be carried out, including but not limited to replacement of the dummy gates 16, 17 and the gate caps 18, 19 with metal gates.

In current technology, a gate sidewall spacer width or lateral thickness of an nFET device may be greater than a gate sidewall spacer width or lateral thickness of a pFET device. The gate sidewall spacer width or thickness is the distance between the gate and the source drain epitaxy region. In current technology, the nFET gate sidewall spacers are protected by a mask while the pFET epitaxy is grown. As such, this results in the pFET source drain epitaxy region being formed in direct contact with the pFET gate sidewall spacers. Subsequently, the mask is removed from above the nFET; however a portion of the mask remains along the gate sidewall spacers of the nFET device. When the nFET source drain epitaxy region is grown, the portion of the mask remaining is between the gate sidewall spacers and the nFET source drain epitaxy region. The nFET gate sidewall spacer width or lateral thickness may be the width or lateral thickness of the gate sidewall spacer plus the width or lateral thickness of the portion of the mask remaining. The pFET gate sidewall spacer width or lateral thickness may be the width of the gate sidewall spacer without the additional thickness of the portion of the mask remaining in the nFET device. Thus, the gate sidewall spacer width or lateral thickness is greater in the nFET than the gate sidewall spacer width or lateral thickness in the pFET device. Thus, the source drain region is further away from the gate in the nFET device compared to the pFET device. The nFET device with thicker spacer width or lateral thickness will negatively impact device performance, i.e. the nFET device will have slower performance compared to the pFET device. The nFET with thicker gate sidewall spacer width or lateral thickness may have degraded device performance compared to the pFET gate sidewall spacer width or lateral thickness, due to longer distance of the nFET gate to the nFET channel compared to the distance of the pFET gate to the pFET channel.

The drawings shown in FIGS. 1-14 describe an exemplary embodiment of semiconductor manufacturing which may be used to fabricate a pFET device and an nFET device which have comparable gate sidewall spacer width or lateral thickness. Gate sidewall spacer width or later thickness directly defines channel length, junction geography and the FET electrical characteristics. Comparable gate sidewall spacer width or lateral thickness for the pFET and the nFET may have an advantage over dual EPI CMOS fabrication in which the nFET gate sidewall spacer width or lateral thickness is generally greater than pFET gate sidewall spacer width or lateral thickness. Comparable gate sidewall width or lateral thickness for the pFET and the nFET may result in comparable electrical characteristics for both.

It may be noted that not all advantages of the present invention are include above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
a p-type field effect transistor (pFET device) and an n-type field effect transistor (nFET device) each having sidewall spacers on opposite sidewalls of a gate, wherein the sidewall spacers of the pFET device are of substantially equal lateral thickness to the sidewall spacers of the nFET device; and
a source drain region adjacent to the sidewall spacers, a distance between the pFET source drain region and the pFET gate is substantially equal to a distance between the nFET source drain region and the nFET gate.

2. The structure of claim 1, further comprising:
a first liner above and in direct contact with the pFET sidewall spacers and the pFET source drain region; and
a second liner above and in direct contact with the nFET sidewall spacers and the NFET source drain region, such that substantially vertical portions of the first liner and the second liner are in direct contact with each other; and
wherein the substantially vertical portion of the first liner and the substantially vertical portion of the second liner are located between the pFET device and the nFET device, and are in direct contact with one another.

3. The structure of claim 1 wherein the first liner comprises silicon.

4. The structure of claim 1, wherein the first liner comprises a metal.

5. A structure comprising:
a p-type field effect transistor (pFET device) including a dummy gate and a pair of sidewall spacers each laterally adjacent to opposing sidewalls thereof; and
an n-type field effect transistor (nFET device) including a dummy gate and pair of sidewall spacers each laterally adjacent to opposing sidewalls thereof, wherein the sidewall spacers of the pFET device are of substantially equal lateral thickness to the sidewall spacers of the nFET device, and wherein a lateral distance between a pFET source drain region adjacent to the sidewall spacers and the pFET dummy gate is substantially equal to a lateral distance between a nFET source drain region adjacent to the sidewall spacers and the nFET dummy gate.

6. The structure of claim 5, further comprising:
a first liner above and in direct contact with the pFET sidewall spacers and the pFET source drain region; and
a second liner above and in direct contact with the nFET sidewall spacers and the NFET source drain region, such that the first liner laterally abuts the second liner; and
wherein a substantially vertical portion of the first liner and a substantially vertical portion of the second liner are located between the pFET device and the nFET device, and are in direct contact with one another.

7. The structure of claim 5, wherein the first liner includes silicon.

8. The structure of claim 5, wherein the first liner includes a metal.

9. The structure of claim 5, wherein the dummy gate includes polysilicon.

10. The structure of claim 5, wherein the dummy gate comprises a metal.

* * * * *